US009000702B2

(12) United States Patent
Huynh et al.

(10) Patent No.: US 9,000,702 B2
(45) Date of Patent: Apr. 7, 2015

(54) POWER MANAGEMENT MULTI-CHIP MODULE WITH SEPARATE HIGH-SIDE DRIVER INTEGRATED CIRCUIT DIE

(71) Applicants: Steven Huynh, Fremont, CA (US); Tsing Hsu, Allen, TX (US)

(72) Inventors: Steven Huynh, Fremont, CA (US); Tsing Hsu, Allen, TX (US)

(73) Assignee: Active-Semi, Inc. (VG)

( * ) Notice: Subject to any disclaimer, the term of this patent is extended or adjusted under 35 U.S.C. 154(b) by 409 days.

(21) Appl. No.: 13/669,416

(22) Filed: Nov. 5, 2012

(65) Prior Publication Data
US 2014/0125266 A1 May 8, 2014

(51) Int. Cl.
*H02P 6/14* (2006.01)

(52) U.S. Cl.
CPC ........................................ *H02P 6/14* (2013.01)

(58) Field of Classification Search
CPC ................................ H02P 6/14; H05K 13/00
USPC ............. 318/400.26, 400.27, 400.28; 438/15, 438/25, 26, 55, 106, 199, 460; 257/265, 257/334, 499, 678, 713; 327/91, 92, 93, 94
See application file for complete search history.

(56) References Cited

U.S. PATENT DOCUMENTS

2009/0194857 A1 * 8/2009 Liu et al. ...................... 257/676

* cited by examiner

Primary Examiner — Antony M Paul
(74) *Attorney, Agent, or Firm* — Imperium Patent Works; T. Lester Wallace; Amir V. Adibi

(57) ABSTRACT

A packaged device includes a first die, a second die, and specially spaced and positioned sets of package terminals. The first die includes a pulse-width modulator (PWM), a processor, a timer, high-side drivers, low-side drivers, and a fault protection circuit. The second die includes ultra-high voltage high-side drivers. In an ultra-high voltage application, the PWM and external circuitry together form a switching power supply that generates a high voltage. The high voltage powers external high-side transistors. The processor and timer control the ultra-high voltage high-side drivers, that in turn supply drive signals to the external high-side transistors through the package terminals. External low-side transistors are driven directly by low-side drivers of the first die. If the fault protection circuit detects an excessive current, then the fault protection circuit supplies a disable signal to high-side and low-side drivers of both dice. The disable signal is generated without execution of processor instructions.

22 Claims, 13 Drawing Sheets

POWER MANAGEMENT MULTI-CHIP MODULE

MOTOR CONTROL APPLICATION

POWER MANAGEMENT MULTI-CHIP MODULE IN A
CEILING FAN CONTROL APPLICATION

POWER MANAGEMENT MULTI-CHIP MODULE

DETAIL OF ONE LOW-SIDE DRIVER AND ONE HIGH-SIDE
DRIVER OF THE FIRST DIE

DETAIL OF ONE HIGH-SIDE DRIVER OF THE ULTRA-HIGH VOLTAGE HIGH-
SIDE DRIVER INTEGRATED CIRCUIT DIE

ULTRA HIGH VOLTAGE LEVEL SHIFT CIRCUIT

POWER MANAGER ately is it appreciated that the summary is illustrative
POWER MANAGEMENT MULTI-CHIP MODULE WITH SEPARATE HIGH-SIDE DRIVER INTEGRATED CIRCUIT DIE

TECHNICAL FIELD

The present disclosure relates generally to processor-controlled high-side and low-side driver circuitry such as for driving inductive loads.

BACKGROUND INFORMATION

FIG. 1 (Prior Art) is a diagram of a conventional microcontroller motor drive circuit. System 10 comprises a power supply 11, a microcontroller 12, three half-bridge driver integrated circuits 13-15, three high-side driver transistors 16-18, three low-side driver transistors 19-21, and a three-winding motor 22. The half-bridge driver integrated circuits 13-15 are standard commercially available integrated circuits. Each half-bridge driver integrated circuit may, for example, be an IR2153 self-oscillating half-bridge driver circuit available from International Rectifier, 101 N. Sepulveda Blvd., El Segundo, Calif. 90245. The high-side driver transistors 16-18 and low-side driver transistors 19-21 are common, commercially available, external discrete N-channel Field Effect Transistors (NFET).

In operation, the power supply 11 supplies a high-voltage supply voltage (for example, approximately +170VDC or +325VDC depending on an input voltage source) via conductor 23 to the half-bridge driver integrated circuits 13-15 and to the high-side driver transistors 16-18 as illustrated. The power supply 11 also outputs a lower voltage DC supply voltage to power the microcontroller 12. The microcontroller 12 supplies control signals to the integrated circuits 13-15 so that certain high-side drivers (not shown) and certain low-side drivers (not shown) in the integrated circuits 13-15 will control certain of the external discrete NFETs 16-21 to be on and others of the NFETs to be off. By appropriate control of which ones of the NFETs 16-21 are on and off, a drive current can be made to flow into the motor 22, through a selected first winding of the motor 22, through a selected second winding of the motor 22, and out of the motor 22. As the motor 22 operates, the microcontroller 12 controls which pairs of motor windings receive the drive current so that the motor 22 is driven correctly.

SUMMARY

A multi-chip module includes a package, a first die and a second die. The package includes specially spaced and positioned sets of package terminals. The first die includes a Pulse-Width Modulator (PWM), a processor, a timer, high-side drivers, low-side drivers, and a fault protection circuit. The second die includes a plurality of ultra-high voltage high-side drivers but includes no low-side drivers. A substrate of the first die, and a P-type substrate of the second die, are both coupled together and to a die paddle of the package.

In an ultra-high voltage application, the PWM and external circuitry of the first die together form a switching power supply from an Alternating Current (AC) input voltage source. The term "ultra-high voltage" typically refers to a voltage in excess of one hundred volts. The switching power supply generates a high voltage VP. A rectified input voltage VIN powers external high-side power transistors. The high voltage VP is received from the power supply back into the multi-chip module through a package terminal, and is supplied via a conductor within the package to the first die. The first die then supplies the high voltage VP to the second die via an inter-die bond wire. This high voltage VP powers a portion of the ultra-high voltage high-side drivers of the second die. The processor and timer of the first die control the ultra-high voltage high-side drivers of the second die, that in turn supply drive signals to the external high-side power transistors through the package terminals. In operation, the voltages on the package output terminals associated with one of the ultra-high voltage high-side drivers can differ by a large voltage (for example, more than eighty volts) from the voltages on the package output terminals associated with another of the ultra-high voltage high-side drivers. The set of package output terminals associated with one of the ultra-high voltage high-side drivers is spaced a minimum of one millimeter away from the sets of package output terminals associated with the others of the ultra-high voltage high-side drivers, and there are no terminals of other types disposed between the sets of ultra-high voltage high-side driver package terminals.

External low-side power transistors are driven directly by low-side drivers of the first die. The external high-side power transistors and the external low-side power transistors are typically coupled into pairs, where each pair drives a common node. The pair of power transistors either couples the common node to a VIN conductor or to a ground GND conductor. Three such common nodes may, for example, be coupled to three corresponding windings of a motor.

Sense voltages from a circuit being driven (for example, a motor circuit) are received via terminals of the package and are monitored by the fault protection circuit of the first die. If as a result of monitoring these sense voltages, the fault protection circuit detects an excessive current in the circuit being driven, then the fault protection circuit of the first die supplies a disable signal to high-side drivers of the second die and to the low-side drivers of the first die. Although the fault protection circuit is configured beforehand by the processor, the disable signal is generated by preconfigured hardware circuitry without execution of processor instructions. Signal propagation delay from the sense voltages, through the fault protection circuit, and to the disable signal is not affected by an execution time of instructions by the processor. High-side drivers of the first die that are not capable of driving the external high-side power transistors due to the ultra-high voltages of the ultra-high voltage application are used to control and drive other external circuitry. In one example, the other external circuitry is three LED (Light Emitting Diode) string drivers.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
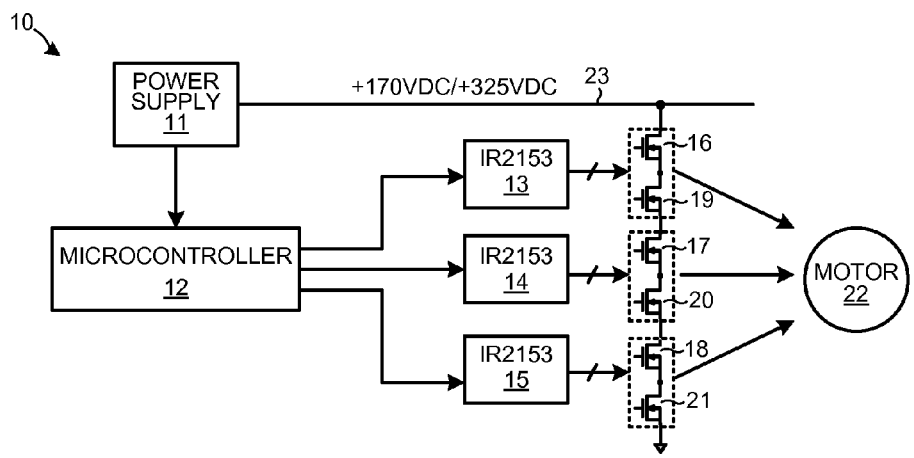
FIG. 1 (Prior Art) is a diagram of a conventional motor controller drive circuit.
Figure 2:
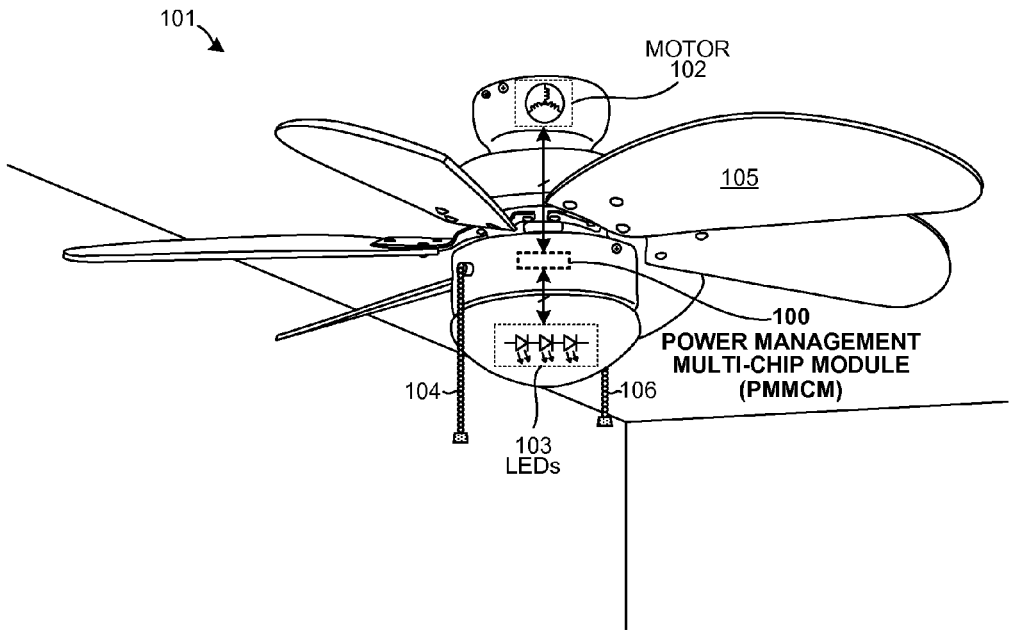
FIG. 2 is a perspective diagram of a Power Management Multi-Chip Module (PMMCM) in a ceiling fan control application where the PMMCM is used to drive a motor and LED lighting of the ceiling fan.

FIG. 2 is a perspective diagram of a Power Management Multi-Chip Module (PMMCM) 100 in an ultra-high voltage application in accordance with one novel aspect. PMMCM 100 is part of a ceiling fan assembly 101. Ceiling fan assembly 101 includes a three-winding motor 102 and three strings of LEDs 103. PMMCM 100 drives motor 102 and the LEDs 103. When a user pulls on a pull chain 104, the PMMCM 100 senses this condition and in response drives motor 102 so that blades 105 rotate. Rotation of the blades 105 is toggled on and off by a user's pulling of pull chain 104. When a user pulls on pull chain 106, PMMCM 100 senses this condition and causes LEDs 103 to be powered so that the LEDs emit light. LEDs 103 are toggled on and off by a user's pulling of pull chain 106.

Figure 3:
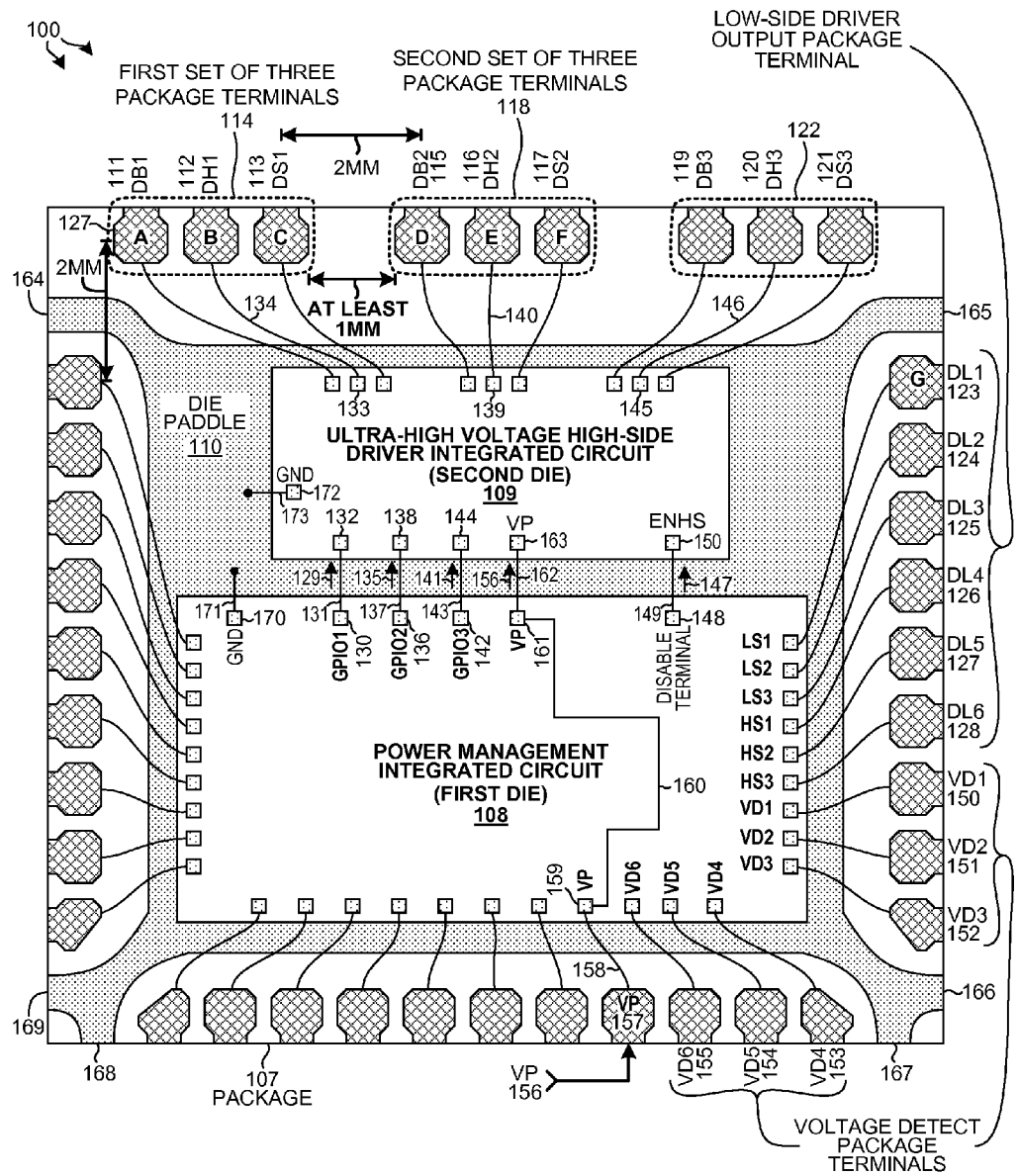
FIG. 3 is a simplified top-down conceptual diagram of the PMMCM of FIG. 2.

FIG. 3 is a simplified top-down conceptual diagram of PMMCM 100. PMMCM 100 includes an integrated circuit package 107, a Power Management Integrated Circuit (PMIC) die 108, and an Ultra-High Voltage High-side Driver Integrated Circuit (UHVHDIC) die 109. PMIC die 108 includes Complementary Metal-Oxide-Semiconductor (CMOS) circuitry but does not include any Double-diffused Metal-Oxide-Semiconductor (DMOS) circuitry capable of operating above one-hundred volts. On the other hand, UHVHDIC die 109 includes DMOS circuitry capable of operating above one-hundred volts.

In this embodiment, package 107 is a Quad-Flat No-leads (QFN) package. Package 107 includes a die paddle 110, four rows of package terminals disposed along the four sides of the package as illustrated, and an amount of an overmolding encapsulant (not shown). Die paddle 110 is equipotential to a P-type substrate of UHVHDIC die 109 and to a substrate of PMIC die 108. A first set of three package terminals 111-113 at the upper side of package 107 is identified with reference numeral 114, a second set of three package terminals 115-117 at the upper side of package 107 is identified with reference numeral 118, and a third set of three package terminals 119-121 at the upper side of package 107 is identified with reference numeral 122. Sets 114, 118 and 122 of package terminals are commonly referred to as "high-side driver output package terminals" because these terminals are often used to drive high voltage control signals to external high-side transistors. Package 107 further includes six package terminals 123-128 referred to as "low-side driver output package terminals." These terminals typically are coupled to external low-side transistors. The external high-side transistors and the external low-side transistors are typically coupled together in pairs so that each pair can either couple a corresponding common node to a high voltage supply conductor or to a ground conductor.

PMIC die 108 controls how each set of the high-side driver output package terminals is driven. For example, PMIC die 108 supplies a first digital control signal 129 via terminal 130, bond wire 131, and terminal 132 to a first high-side driver in UHVHDIC die 109. This digital control signal 129 can cause the first high-side driver to be turned on to drive high-side output terminal DH1 112 via terminal 133 and bond wire 134 to a high voltage. PMIC die 108 supplies a second digital control signal 135 via terminal 136, bond wire 137, and terminal 138 to a second high-side driver in UHVHDIC die 109. This digital control signal 135 can cause the second high-side driver to be turned on to drive high-side output terminal DH2 116 via terminal 139 and bond wire 140 to a high voltage. PMIC die 108 supplies a third digital control signal 141 via terminal 142, bond wire 143, and terminal 144 to a third high-side driver in UHVHDIC die 109. This digital control signal 141 can cause the third high-side driver to be turned on to drive high-side output terminal DH3 120 via terminal 145 and bond wire 146 to a high voltage. In this fashion, PMIC die 108 controls whether or not each of the high-side driver output package terminals DH1, DH2 and DH3 is driven to a high level.

PMIC die 108 supplies a digital logic enable signal ENHS2 147 via disable terminal 148 and fault signal conductor bond wire 149 to terminal 150 of UHVHDIC die 109. Asserting the ENHS2 signal 147 high enables the high-side drivers of UHVHDIC die 109, whereas deasserting the ENHS2 signal 147 low disables the high-side drivers of UHVHDIC die 109. PMIC die 108 includes a protection control circuit shown in FIG. 4. During operation of PMMCM 100, the protection control circuit deasserts the ENHS2 signal 147 if a voltage present on any one of the voltage detect package terminals 150-155 exceeds a predetermined voltage level. The digital logic enable signal ENHS2 147 is communicated directly from the protection control circuit in PMIC die 108, out of disable terminal 148, across fault signal conductor 149 of the package, and to the input terminal ENHS 150 of UHVHDIC die 109 without being dependent upon any software processing. Although the protection control circuit is initially configured by the processor, once configured, a signal propagation delay from one of the voltage detect package terminals (for example, terminal package 150), through the protection control circuit, and to disable terminal 148 of PMIC die 108 is not affected by an execution time of any instruction executed by any processor. The protection control circuit also generates digital logic enable signals ENLS1 and ENHS1 that are similar to signal ENHS2. Signals ENLS1 and ENHS1 are output by the protection control circuit and are supplied within PMIC die 108 to disable low-side drivers and high-side drivers of the PMIC die 108, respectively.

PMIC die 108 includes pulse width modulation circuitry (see FIG. 8) that is part of a switching power supply. The switching power supply generates a high voltage supply voltage VP 156 that is supplied onto PMMCM 100 via package terminal VP 157. Supply voltage VP 156 is supplied onto PMIC die 108 via bond wire 158 and terminal VP 159 of the PMIC die 108. PMIC die 108 supplies supply voltage VP 156 to UHVHDIC die 109 via conductor 160, through terminal 161, via bond wire 162, and onto terminal VP 163 of the UHVHDIC die 109. Supply voltage VP 156 is supplied to high-side and low-side drivers of each die, as shown in FIG. 4.

Die paddle 110 is exposed at a bottom side of the PMMCM 100 thereby allowing PMMCM 100 to be used both as a ground connection to external circuitry and as a heat sink. Die paddle 110 includes molding mechanical stabilizer portions 164-169. Ground terminal 170 of the PMIC die 108 is coupled to die paddle 110 via bond wire 171, and ground terminal 172 of the UHVHDIC die 109 is coupled to die paddle 110 via bond wire 173. Die paddle 110 is equipotential to the P-type substrate of UHVHDIC die 109 and to the substrate of PMIC die 108. In this fashion, die paddle 110 is usable to supply a ground potential to the PMIC die 108 and to the UHVHDIC die 109.

During operation of PMMCM 100, voltages present on each of the first set of three package terminals 114 are within twenty volts of each other. For example, a voltage present on terminal DB1 111 is within twenty volts of another voltage present on terminal DH1 112 at an instant in time during operation of PMMCM 100. Similarly, voltages present on each of the second set of three package terminals 118 are within twenty volts of each other and voltages present on each of the third set of three package terminals 122 are also within twenty volts of each other at an instant in time during operation of PMMCM 100.

During operation of PMMCM 100, a difference in voltage between a voltage present on one of the first set of three package terminals 114 and another voltage present on one of the second set of three package terminals 118 is at least eighty volts. For example, if a first voltage is present on terminal DH1 112 at an instant in time during operation of PMMCM 100 and a second voltage is present on terminal DH2 116 at the instant in time, then the difference between the first voltage and the second voltage is at least eighty volts. In the ultra-high voltage application of FIG. 2, the difference between the first voltage and the second voltage is at least one-hundred volts and can be as great as six-hundred volts during operation of PMMCM 100.

FIG. 4 is a circuit diagram of the ceiling fan 101 of FIG. 2. FIGS. 4A, 4B, 4C, 4D and 4E fit together to form FIG. 4. A key showing how FIGS. 4A, 4B, 4C, 4D and 4E fit together in this way is provided at the bottom left of FIG. 4A. The ceiling fan circuit includes PMMCM 100 and external circuit components 201-219. External circuitry 201-219 is coupled to the power manager 220 of PMIC die 108. The power manager 220 is then configured so that the power manager and the external components together form a flyback switching power supply. The switching power supply generates a +12 volt supply voltage VP. The +12 volt supply voltage is supplied to the high-side and low-side driver circuitry of PMMCM 100. The internal details of power manager 220 are omitted from FIG. 4 due to space constraints in the drawings. See FIG. 8 for additional details. In addition to generating the supply voltage VP, the power supply also generates an approximately +170 volt or +325 volt Direct Current (DC) supply voltage VIN (depending on the input voltage source). VIN is actually a rough DC voltage generated by the bridge rectifier 202 and capacitor 203 of the power supply. The +170 volt or +325 volt DC input voltage VIN is supplied to motor 102 and LEDs 103.

The flyback switching power supply operates as follows. An AC input source 201 is the source of power. The AC input power source 201 is either a 120 volt or 230 volt AC standard mains supply. The 120VAC or 230VAC is full wave rectified by diode bridge 202. The rectified voltage is smoothed by storage capacitor 203 such that the rough +170 volt or +325 volt DC input voltage VIN is present on node 204. A Field Effect Transistor (FET) 205 is coupled to pull pulses of current from VIN node 204 through a primary winding of a transformer 206. Power manager 220 controls transistor 205 by driving a voltage on terminal DRM 207. Resistor 208 is a current sense resistor. Power manager 220 includes a CSM mode detect block (not shown) for detecting a low-side current sense configuration. A first secondary winding 210 and a second secondary winding 211 are provided with rectifying diodes 212 and 213 and storage capacitors 214 and 215 to generate the main supply output voltage VP 156 onto terminal VP 157 and output voltage VISO 216 onto node 217. In this example, VP is +12.0 volts. Output voltage VISO 216 has a ground 218 isolated from the ground 219 of secondary winding 211. If the magnitude of the sensed voltage VP is lower than desired, then power manager 220 controls the switching of transistor 205 so that its on pulses are of longer duration. If the magnitude of the sensed voltage VP is higher than desired, then power manager 220 controls the switching of transistor 205 so that its on pulses are of shorter duration.

In addition to power manager 220, the PMIC die 108 includes a processor 221, a memory 222, local bus 223, timers 224-232, low-side drivers 233-235, high-side drivers 236-238, protection control circuit 239, event detector circuit 240, analog-to-digital converter 241, 6:1 multiplexer 242, and differential amplifiers 243-248. On startup, processor 221 reads program code 249 from memory 222 over local bus 223, and configures power manager 220 to operate as the pulse width modulator of a flyback converter.

UHVHDIC die 109 includes ultra-high voltage high-side drivers 250, 251 and 252. Processor 221 and timers 224, 225 and 226 of PMIC die 108 control ultra-high voltage high-side drivers 250, 251 and 252 of UHVHDIC die 109. Timer 224 supplies digital control signal 129 onto terminal GPIO1 130, through bond wire 131, through terminal 132, and onto high-side driver 250. Timer 225 supplies digital control signal 135 onto terminal GPIO2 136, through bond wire 137, through terminal 138, and onto high-side driver 251. Timer 226 supplies digital control signal 141 onto terminal GPIO3 142, through bond wire 143, through terminal 144, and onto high-side driver 252. Each of the high-side drivers 250, 251 and 252 in turn supplies drive signals to external high-side transistors 254, 255 and 256. High-side driver 250 supplies drive signal 257 through die terminal 133, through bond wire 134, through package terminal DH1 112 and onto a gate of high-side transistor 254. High-side driver 251 supplies drive signal 258 through die terminal 139, through bond wire 140, through package terminal DH2 116 and onto a gate of high-side transistor 255. High-side driver 252 supplies drive signal 259 through die terminal 145, through bond wire 146, through package terminal DH3 120 and onto a gate of high-side transistor 256.

Processor 221 and timers 227, 228 and 229 control low-side drivers 233, 234 and 235 within PMIC die 108. Each of the low-side drivers 233, 234 and 235 in turn supplies a drive signal to a corresponding one of external low-side transistors 260, 261 and 262. Low-side driver 233 supplies drive signal 263 through die terminal LS1 264, through bond wire 265, through package terminal DL1 123 and onto a gate of low-side transistor 260. Low-side driver 234 supplies drive signal 266 through die terminal LS2 267, through bond wire 268, through package terminal DL2 124 and onto a gate of low-side transistor 261. Low-side driver 235 supplies drive signal 269 through die terminal LS3 270, through bond wire 271, through package terminal DL3 125 and onto a gate of low-side transistor 262. In this fashion, processor 221 controls ultra-high voltage high-side drivers 250, 251 and 252 of UHVHDIC die 109 and low-side drivers 233, 234 and 235.

Processor 221 and timers 230, 231 and 232 control high-side drivers 236, 237 and 238 of PMIC die 108. Each of the high-side drivers 236, 237 and 238 in turn supplies a drive signal to a corresponding one of the external low-side transistors 272, 273 and 274. Timer 230 supplies drive signal 275 through die terminal HS1 276, through bond wire 277, through package terminal DL4 126 and onto a gate of low-side transistor 272. Timer 231 supplies drive signal 278 through die terminal HS2 279, through bond wire 280, through package terminal DL5 127 and onto a gate of low-side transistor 273. Timer 232 supplies drive signal 281 through die terminal HS3 282, through bond wire 283, through package terminal DL6 128 and onto a gate of low-side transistor 274. Each of high-side drivers 236, 237 and 238 includes a metal option connection to supply voltage VP and a metal option connection to GND. In this embodiment, high-side drivers 236, 237 and 238 are configured by this metal option to drive external pull-down N-channel transistors, and thereby function as low-side drivers.

Protection control circuit 239 is configured to disable low-side and high-side driver circuitry when a voltage detected on a package terminal is above a pre-determined threshold thereby cutting power to motor 102 and LEDs 103. Resistors 284, 285 and 286 are current sense resistors. Differential amplifiers 243, 244 and 245 of the PMIC die 108 are coupled so that they can measure and monitor voltage drops across the three current sense resistors 284, 285 and 286. The non-inverting input of differential amplifier 243 receives a voltage from a lead of current sense resistor 284 via package terminal VD1 150, bond wire 287 and die terminal VD1 288. The inverting input of differential amplifier 243 receives a voltage from the other lead of current sense resistor 284 via package terminal VD2 151, bond wire 289 and die terminal VD2 290. The non-inverting input of differential amplifier 244 receives a voltage from a lead of current sense resistor 285 via package terminal VD3 152, bond wire 291 and die terminal VD3 292. The inverting input of differential amplifier 244 receives a voltage from the other lead of current sense resistor 285 via package terminal VD4 153, bond wire 293 and die terminal VD4 294. The non-inverting input of differential amplifier 245 receives a voltage from a lead of current sense resistor 286 via package terminal VD5 154, bond wire 295 and die terminal VD5 296. The inverting input of differential amplifier 245 receives a voltage from the other lead of current sense resistor 286 via package terminal VD6 155, bond wire 297 and die terminal VD6 298. Each of the outputs of the differential amplifiers 243, 244 and 245 is indicative of a magnitude of a voltage drop across a respective one of the current sense resistors 284, 285 and 286.

Protection control circuit 239 receives the signals output from differential amplifiers 243, 244 and 245. Protection control circuit 239 generates digital logic output signals ENLS1, ENHS1, and ENHS2 as a programmable logic function of programmable voltage level detection of each of the three input signals. The programmable logic function and programmable detection levels are programmable by processor 221 by writing control bits into a control register (not shown) of the protection control circuit 239 across bus 223. In the illustrated example, the protection control circuit 239 is configured such that if a sensed voltage drop across any one of the current sense resistors is above the pre-determined threshold, then protection control circuit 239 de-asserts each of the digital logic enable signals ENLS1 299, ENHS1 300 and ENHS2 147. Signal ENLS1 299 is communicated via conductor 301 so that low-side drivers 233, 234 and 235 are disabled. Signal ENHS1 is communicated via conductor 302 thereby disabling high-side drivers 236, 237 and 238. Signal ENHS2 147 is communicated via disable terminal ENHS 148 and conductor 149 to terminal ENHS 150 of UHVHDIC die 109, thereby disabling ultra-high voltage high-side drivers 250, 251 and 252. Disabling the high-side and low-side circuitry of PMMCM 100 in this manner cuts power to motor 102 and to LEDs 103.

Protection control circuit 239 generates digital logic enable signals ENLS1 299, ENHS1 300 and ENHS2 147 without any execution of instructions by processor 221. Protection control circuit 239 is coupled to high-side driver circuitry of the UHVHDIC die 109 without needing to communicate across local bus 223 to disable high-side drivers 250, 251 and 252 of the UHVHDIC die 109. Consider voltage detect package terminals VD1 150 and VD2 151 coupled to current sense resistor 284. If protection control circuit 239 senses a voltage drop across resistor 284 that exceeds a pre-determined threshold, for example, when motor 102 is drawing more current from VIN node 204 than acceptable, then protection control circuit 239 de-asserts the digital logic enable signal ENHS2 147 thereby disabling high-side drivers 250, 251 and 252 of the UHVHDIC die 109. As such, the signal propagation delay from voltage detect package terminal VD1 150 to the disable terminal 148 of PMIC die 108 is not affected by an execution time of any instruction executed by the processor 221.

Motor Control

Figure 4A:
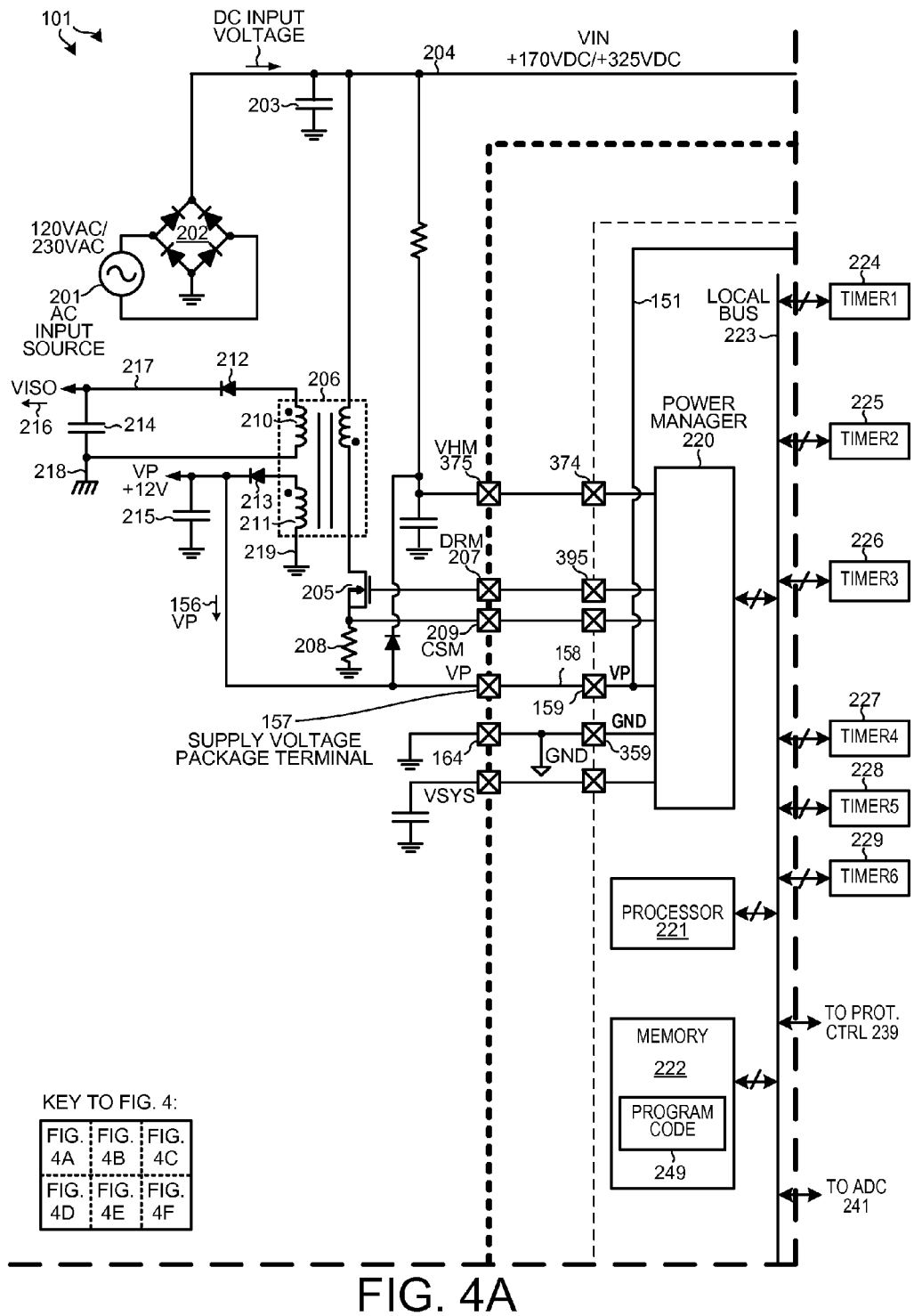
FIGS. 4A, 4B, 4C, 4D, 4E and 4F is a circuit diagram of the ceiling fan of FIG. 2.
Figure 4B:
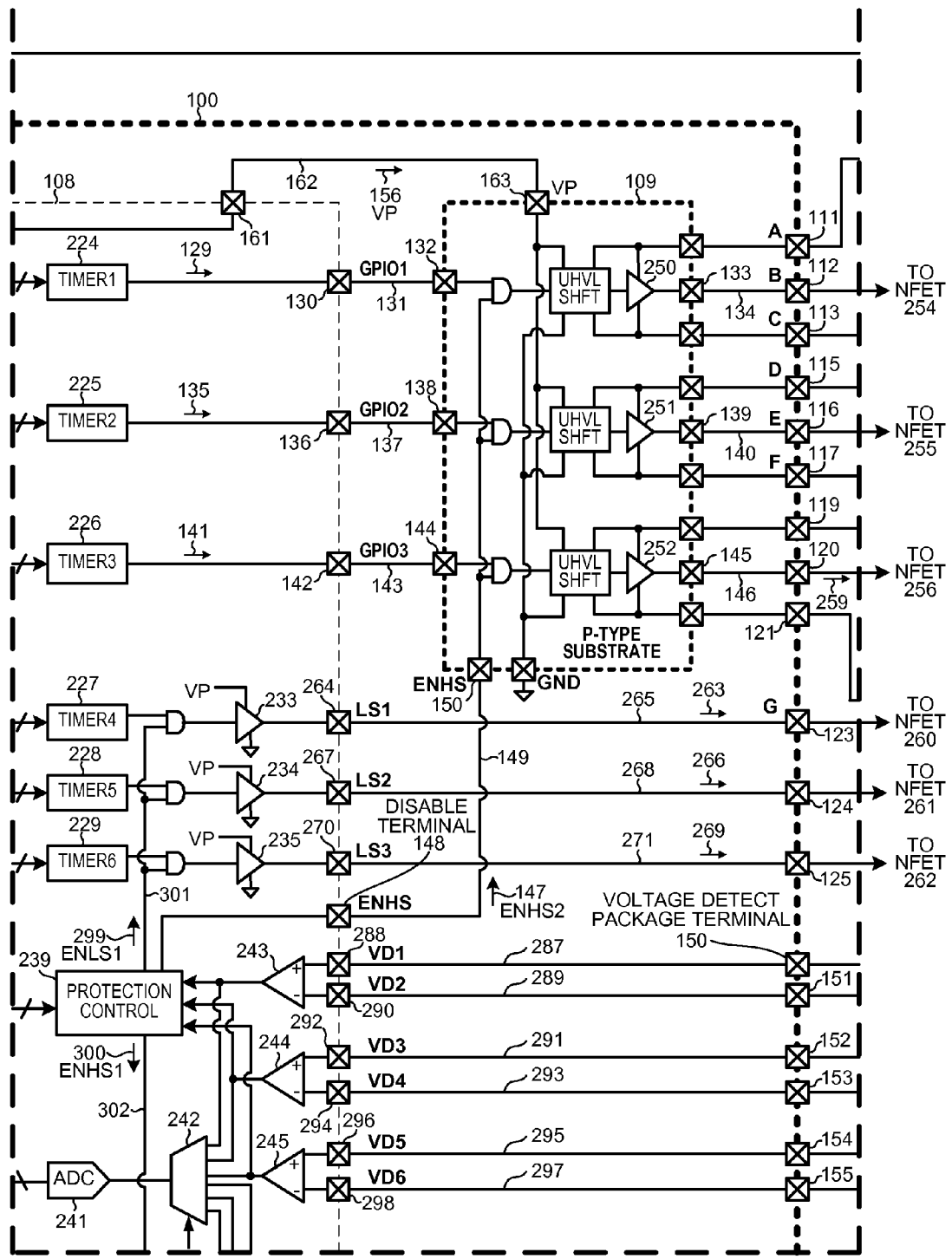
Figure 4C:
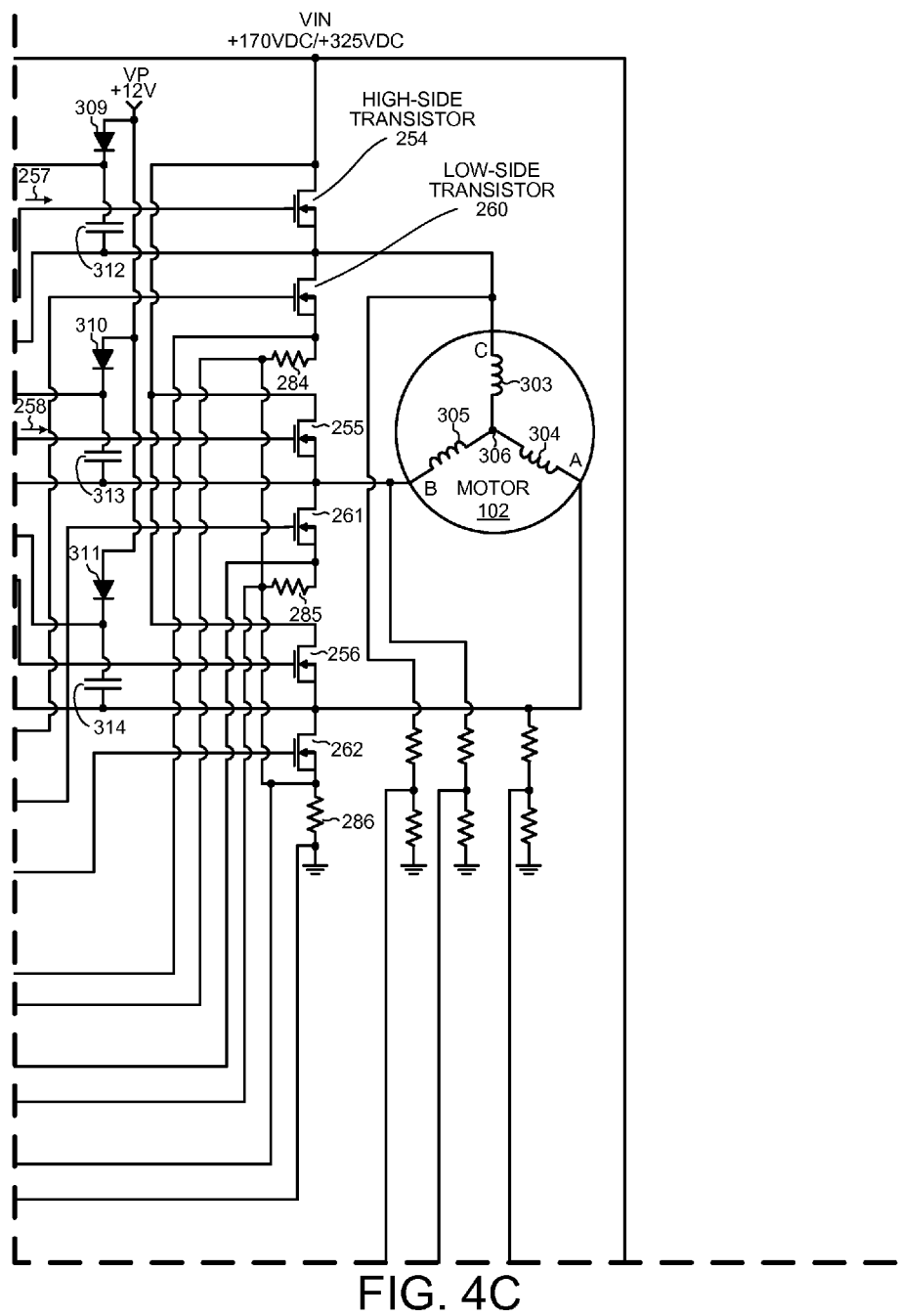
Figure 4D:
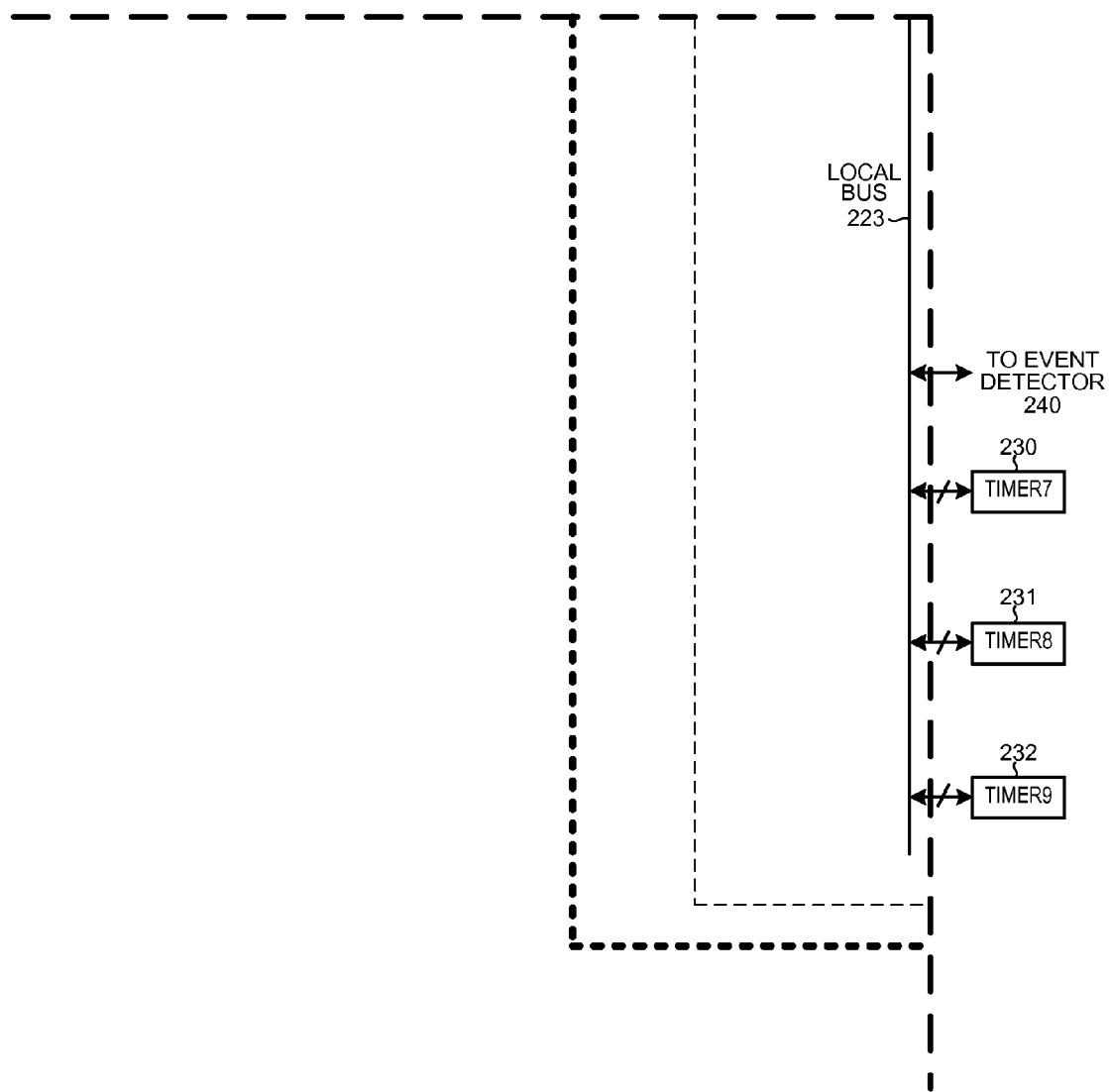
Figure 4E:
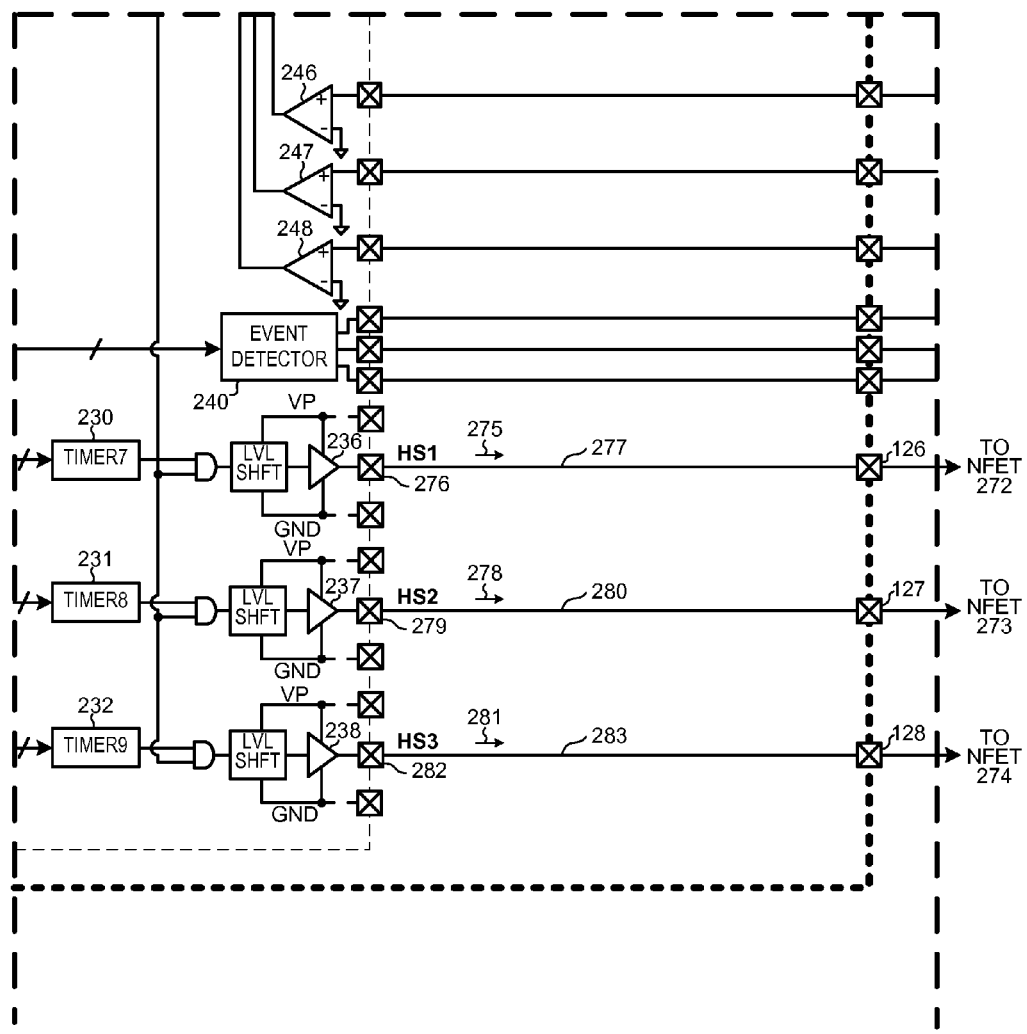
Figure 4F:
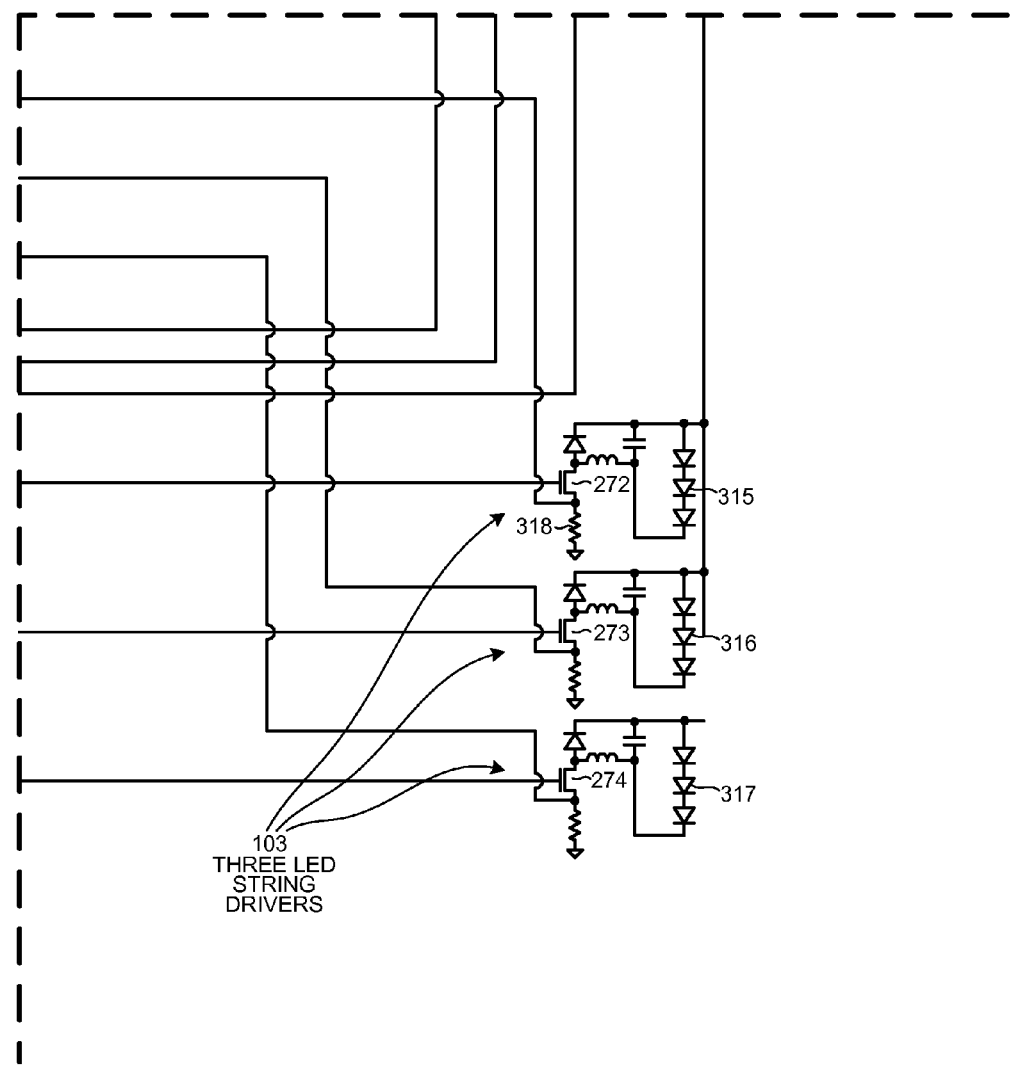

Motor 102 includes three windings 303, 304 and 305. Each of the three motor windings 303, 304 and 305 is coupled to a corresponding pair of external discrete NFETs as illustrated in FIG. 4C. Each pair of discrete NFETs includes a high-side discrete NFET and a low-side discrete NFET. The high-side NFETs are identified by reference numerals 254, 255 and 256. The low-side NFETs are identified by reference numerals 260, 261 and 262. High-side driver 250 within the UHVHDIC die 109 controls the external high-side discrete NFET 254 by driving a control signal 257 through terminal 133 and out of package terminal DH1 112. Low-side driver 233 within PMIC die 108 controls the external low-side NFET 260 by driving a control signal 263 through terminal LS1 264 and out of package terminal DL1 123. High-side driver 251 within UHVHDIC die 109 controls the external high-side discrete NFET 255 by driving a control signal 258 through terminal 139 and out of package terminal DH2 116. Low-side driver 234 within PMIC die 108 controls the external low-side NFET 261 by driving a control signal 266 out of terminal LS2 267 and out of package terminal DL2 124. High-side driver 252 within UHVHDIC die 109 controls the external high-side discrete NFET 256 by driving a control signal 259 through terminal 145 and out of package terminal DH3 120. Low-side driver 235 within PMIC die 108 controls the external low-side NFET 262 by driving a control signal 269 out of terminal LS3 270 and onto package terminal DL3 125.

Current flow through motor 102 involves current flow from the +170 volt or +325 volt VIN conductor 204, through a selected one of the high-side discrete NFETs, through one winding, to center node 306 of motor 102, and from the center node 306 of motor 102 through another winding, and then through one or more current sense resistors to ground node and ground conductor. The processor 221 of the PMIC 108 executes processor-executable instructions stored in memory 222 identified by reference numeral 249. As a result of execution of these processor-executable instructions, processor 221 monitors operation of motor 102 and communicates control information to high-side drivers 250, 251 and 252 of UHVHDIC die 109 and low-side drivers 233, 234 and 235 of PMIC die 108, thereby controlling the high-side drivers and the low-side drivers to turn off and on selected ones of their associated external discrete NFETs 254-256 and 260-262 at appropriate times so that currents flow through the windings of the motor as appropriate to drive motor 102.

Each high-side driver 250, 251 and 252 of UHVHDIC die 109 is coupled to a charging diode and a bootstrap capacitor as illustrated. The charging diodes are identified by reference numerals 309, 310 and 311. The bootstrap capacitors are identified by reference numerals 312, 313 and 314. For more information on operation of charging diodes and bootstrap capacitors, see: U.S. patent application Ser. No. 13/315,282, entitled "Power Manager Tile For Multi-Tile Power Management Integrated Circuit", filed Dec. 8, 2011, by Steven Huynh (the entire subject matter of which is incorporated herein by reference).

Resistors 284, 285 and 286 are current sense resistors. Differential amplifiers 243, 244 and 245 of the PMIC die 108 are coupled so that they can measure and monitor the voltage drops across the three current sense resistors 284, 285 and 286. The outputs of the differential amplifiers 243, 244 and 245 are supplied onto ADC 241 through programmable 6:1 multiplexer 242, and ADC 241 converts the outputs of the differential amplifiers 243, 244 and 245 into corresponding digital values. The resulting digital values are indicative of the magnitudes of the voltage drops across current sense resistors 284, 285 and 286. Processor 221 of the PMIC die 108 reads these digital values and based on the digital values and other information determines how to control the high-side and low-side drivers.

LED Lighting

LED lighting 103 comprises three strings of LEDs 315, 316 and 317. The three strings of LEDs 315, 316 and 317 are powered from the VIN node 204. Pull-down NFETs 272, 273 and 274 associated with each LED string is provided to conduct pulses of current through the string. When the NFET is pulsed on, current flow through the associated inductor increases, whereas when the NFET is off, current flow though the inductor decreases. The on-time of the NFET is pulse width modulated in order to control the average current drawn through an associated LED string. When the NFET is on, current flows through the LED string, through the inductor, through the NFET, through the current sense resistor, and to ground conductor. In the case of LED string 315, the NFET is 272 and the current sense resistor is resistor 318. Differential amplifier 246 of PMIC die 108 and ADC 241 is used to monitor the magnitude of this current. When the NFET is turned off, current flows through the LED string, through the inductor, and back through the diode to the VIN conductor 204. The pulse width modulated signal is generated by timer 230 of the PMIC die 108.

Figure 5:
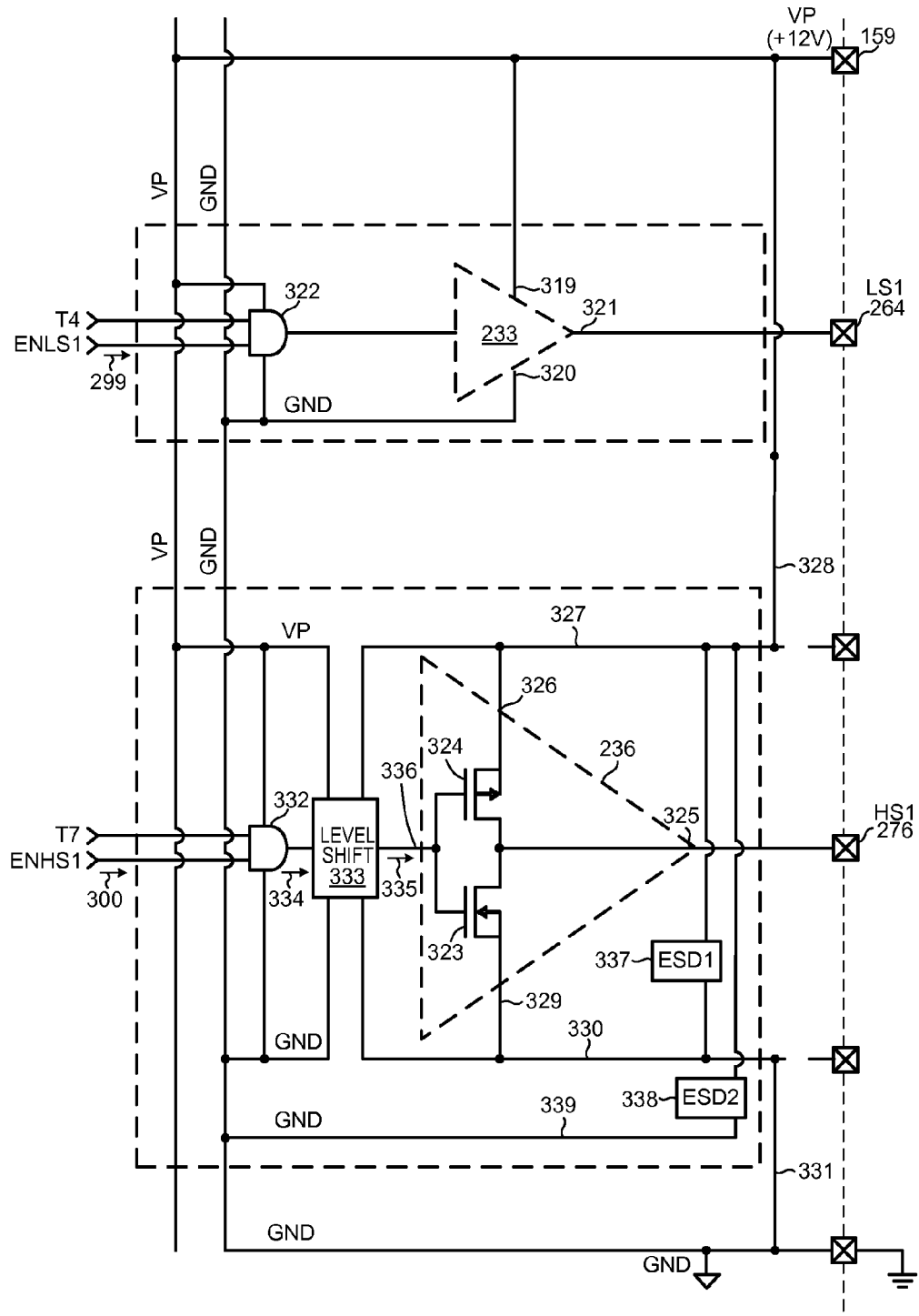
FIG. 5 is a more detailed circuit diagram of one low-side driver and one high-side driver of the Power Management Integrated Circuit (PMIC) die.

FIG. 5 is a more detailed circuit diagram of one low-side driver 233 and one high-side driver 236 of PMIC die 108. Low-side driver 233 controls external discrete NFET 260 via terminal LS1 264 that is coupled to package terminal DL1 123. The +12 volt supply voltage VP is supplied onto supply voltage lead 319 of low-side driver 233. Ground voltage lead 320 is coupled to ground. To turn external discrete NFET 260 on, low-side driver 233 drives the VP voltage on lead 319 onto terminal LS1 264, onto package terminal DL1 123, and onto the gate of NFET 260. To turn external discrete NFET 260 off, low-side driver 233 drives the voltage on lead 320 onto terminal LS1 264, onto package terminal DL1 123, and onto the gate of NFET 260.

Block 322 represents digital logic that supplies a digital logic control signal to turn on or to turn off the external discrete NFET 260. Processor 221 of PMIC die 108 controls block 322 by controlling the digital input signal supplied from timer 227 to block 322. The digital logic high potential for block 322 is the supply voltage VP, and the digital logic low potential for block 322 is ground potential GND.

High-side driver 236 includes an N-channel Field Effect Transistor (FET) transistor 323 and a P-channel FET 324. The P-channel and N-channel FETs 323 and 324 are interconnected as a complementary logic inverter. The output 325 of the inverter is coupled via a terminal HS1 276, to package terminal DL4 126 of PMMCM 100 to the gate of external discrete NFET 272. Supply voltage lead 326 of the high-side driver 236 is coupled to supply conductor 327. Supply conductor 327 is coupled to a metal option connection 328 to +12 volt supply voltage VP. Ground voltage lead 329 is coupled to ground conductor 330. Ground conductor 330 is coupled to a metal option connection 331 to ground. To turn external discrete NFET 272 on, high-side driver 236 drives the +12 volt supply voltage VP on conductor 327 onto terminal HS1 276, onto package terminal DL4 126, and onto the gate of NFET 272. To turn external discrete NFET 272 off, high-side driver 236 drives the voltage on conductor 330 onto terminal HS1 276, package terminal DL4 126, and onto the gate of NFET 272.

Block 332 represents digital logic that supplies a digital logic control signal to turn on or to turn off the external discrete NFET 272. Processor 221 of PMIC die 108 controls block 332 by controlling the digital input signal supplied from timer 230 to block 332. The digital logic high potential for block 332 is the supply voltage VP, and the digital logic low potential for block 332 is ground potential GND.

Block 333 represents a level shift circuit that receives the digital logic control signal 334 output from block 332 and level shifts the signal so that it is output as a digital logic control signal 335 onto input lead 336 of high-side driver 236. The digital logic control signal 335 swings between a digital high voltage level of +12 volts VP on conductor 327 and a digital low voltage level of the voltage on conductor 330. A first electrostatic discharge protection circuit (ESD1) 337 is coupled between conductor 327 and conductor 330. A second electrostatic discharge protection circuit (ESD2) 338 is coupled between conductor 327 and conductor 339.

Figure 6:
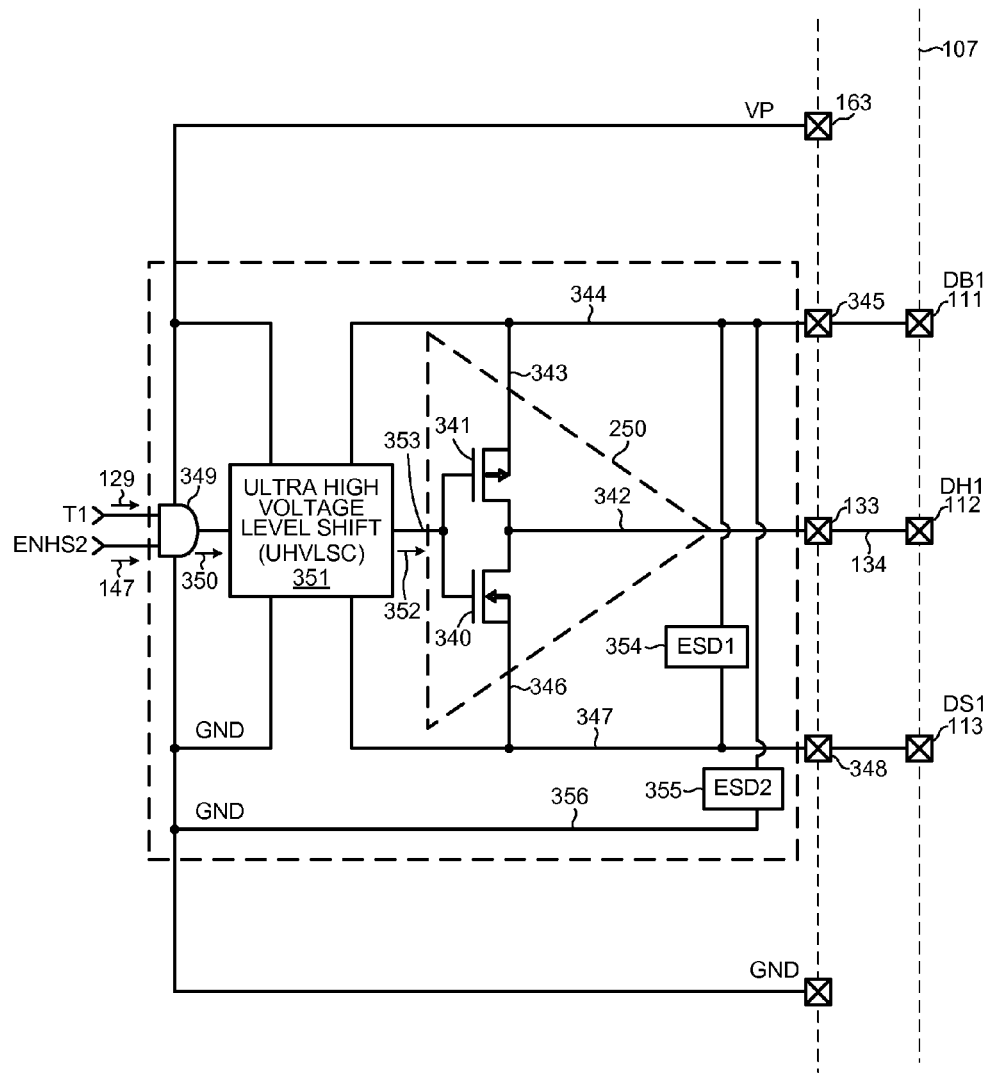
FIG. 6 is a more detailed circuit diagram of one high-side driver of the Ultra-High Voltage High-side Driver Integrated Circuit (UHVHDIC) die.

FIG. 6 is a more detailed circuit diagram of one high-side driver of the UHVHSDIC die 109. High-side driver 250 includes an N-channel transistor 340 and a P-channel transistor 341. The N-channel and P-channel transistors 340 and 341 are interconnected as a complementary logic inverter. The output 342 of the inverter is coupled via terminal 133, to bond wire 134, to package terminal DH1 112 and to the gate of external discrete high-side NFET 254. Supply voltage lead 343 of the high-side driver 250 is coupled to supply conductor 344 and terminal 345. Source lead 346 is coupled to conductor 347 and terminal 348. To turn external discrete NFET 254 on, high-side driver 250 drives the voltage on conductor 344 onto terminal 133, onto bond wire 134, onto package terminal DH1 112, and onto the gate of NFET 254. To turn external discrete NFET 254 off, high-side driver 250 drives the voltage on conductor 347 onto terminal 133, onto bond wire 134, onto package terminal DH1 112, and onto the gate of NFET 254.

Block 349 represents digital logic that supplies a digital logic control signal 350 to turn on or to turn off the external discrete NFET 254. Processor 221 of PMIC die 108 controls block 349 by controlling the digital input signal 129 supplied from timer 224 onto block 349. The digital logic high potential for block 349 is the supply voltage VP, and the digital logic low potential for block 349 is ground potential GND.

Block 351 represents an Ultra-High Voltage Level Shift Circuit (UHVLSC) that receives digital logic control signal 350 from logic 349 and level shifts the signal so that it is output as a digital logic control signal 352 onto input lead 353 of high-side driver 250. The digital logic control signal 352 swings between a digital high voltage level on conductor 344 and a digital low voltage level of the voltage on conductor 347. A first electrostatic discharge protection circuit (ESD1) 354 is coupled between conductor 344 and conductor 347. A second electrostatic discharge protection circuit (ESD2) 355 is coupled between conductor 344 and conductor 356.

Figure 7:
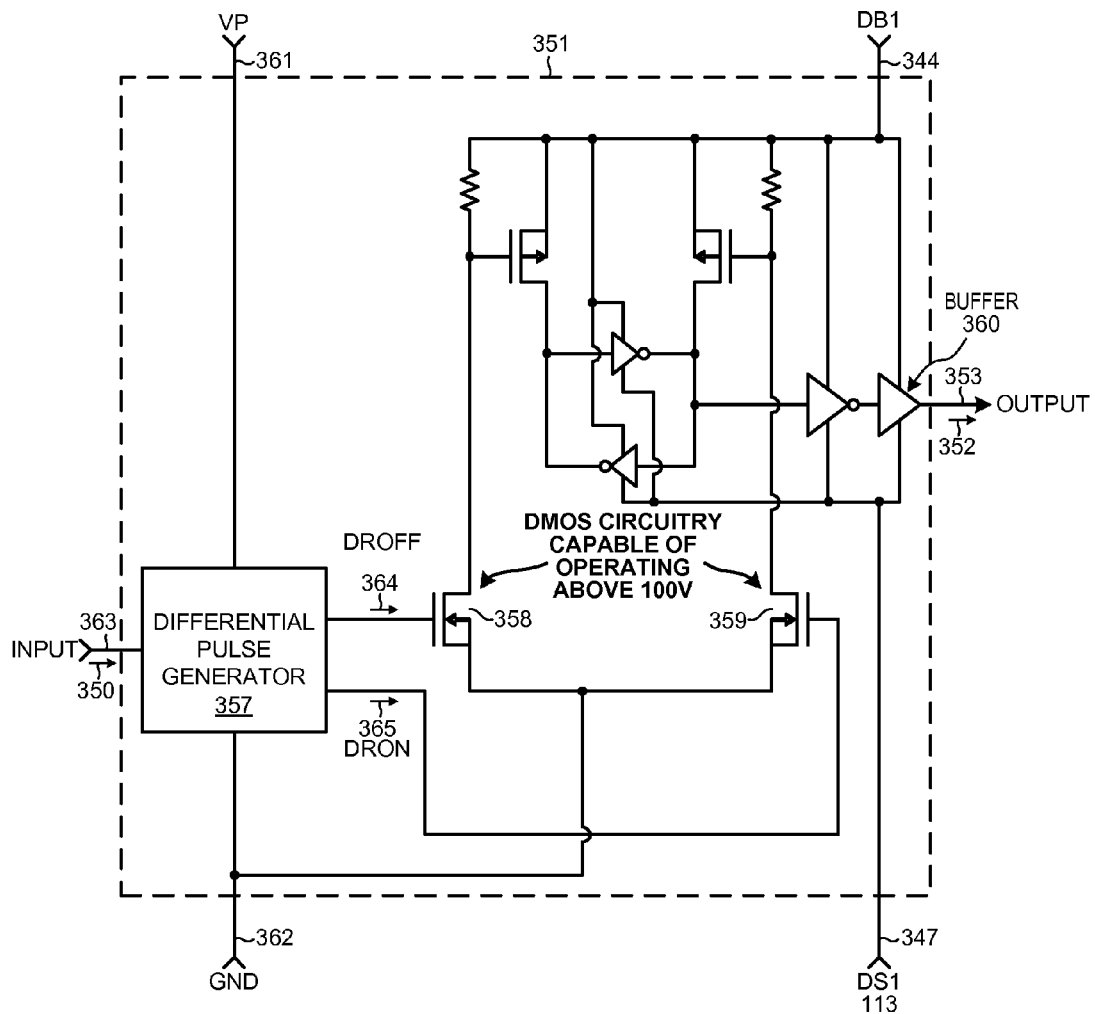
FIG. 7 is a more detailed circuit diagram of the Ultra High Voltage Level Shift Circuit (UHVLSC) of FIG. 6.

FIG. 7 is a more detailed circuit diagram of UHVLSC 351 of FIG. 6. UHVLSC 333 includes a differential pulse generator 357, Double-diffused Metal-Oxide-Semiconductor (DMOS) transistors 358 and 359, digital buffer 360 and additional circuitry. Differential pulse generator 357 receives supply voltage VP via conductor 361 and ground via ground conductor 362. Digital logic control signal 350 is supplied onto differential pulse generator 357 via input conductor 363, and differential pulse generator 357 generates pulses DROFF 364 and DRON 365 that are supplied onto gates of DMOS transistors 358 and 359, respectively. The DMOS transistors 358 and 359 are capable of operating higher than one-hundred volts at their drains, thereby allowing level shifting of the pulses to the ultra-high voltages supplied by terminals DB1 111 and DS1 113. Buffer 360 receives a voltage on terminal DB1 111 via die terminal 345 and conductor 344. Buffer 360 receives voltage on terminal DS1 113 via die terminal 348 and conductor 347. Buffer 360 outputs the level-shifted control signal as digital logic control signal 352 onto high-side driver 250 via output conductor 353. Digital logic control signal 352 swings between a digital high voltage level on terminal DB1 111 and a digital low voltage level on terminal DS1 113. In accordance with one novel aspect, UHVHSDIC die 109 includes DMOS circuitry capable of operating above one-hundred volts and CMOS circuitry. On the other hand, PMIC die 108 includes CMOS circuitry, but does not include any DMOS circuitry capable of operating above one-hundred volts.

Figure 8:
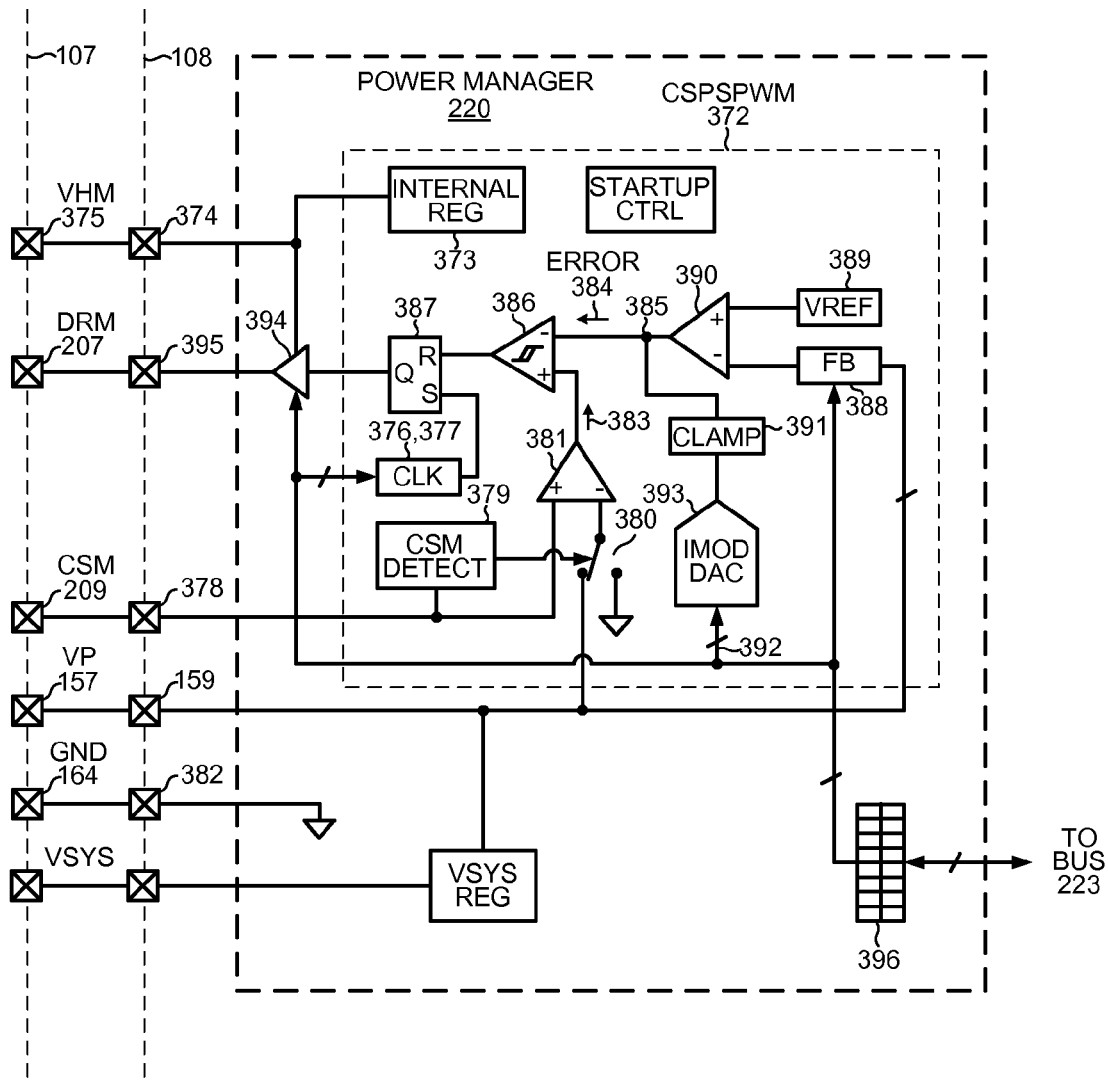
FIG. 8 is a more detailed diagram of the power manager circuit of the PMIC die.

FIG. 8 is a more detailed diagram of power manager circuit 220 of the PMIC die 108. For additional information regarding power manager 220, see: 1) U.S. patent application Ser. No. 13/315,282, entitled "Power Manager Tile For Multi-Tile Power Management Integrated Circuit," filed Dec. 8, 2011, by Huynh (the entire subject matter of this patent document is incorporated herein by reference). Power manager circuit 220 is operable to receive power from a selectable one of a variety of different external power sources that might be available in a given application. The power manager circuit 220 outputs supply voltages that satisfy all the power needs of the PMMCM 100. To achieve this flexibility, power manager 220 includes a set of configurable pulse width modulator components referred to as the Configurable Switching Power Supply Pulse Width Modulator (CSPSPWM) 372. The CSPSPWM 372 is configurable in different ways along with a small number of select external components (external to PMMCM 100) to realize a step-down converter, a high voltage step down converter, a flyback converter, or a boost converter. In the present ultra-high voltage application example, CSPSPWM 372 is configured to form a flyback converter.

CSPSPWM 372 includes a small, low-output current internal linear regulator 373. This internal linear regulator 373 receives an unregulated voltage via a die terminal 374 and package terminal VHM 375, and outputs a regulated 4.5 volt DC source. Internal regulator 373 does include a small capacitor but because the regulator 373 only outputs a maximum of 1 milliamperes of supply current, the capacitor of the linear regulator can be provided on-chip. Connections between the internal regulator 373 to the other circuits of CSPSPWM 372 are not shown, but the internal regulator 373 is used to power the remainder of the CSPSPWM 372.

An internal RC oscillator 376 generates a 4 MHz signal. This 4 MHz signal is divided down by programmable divider 377 to generate an output square wave digital signal that starts each pulse of the signal output by CSPSPWM 372. The frequency of the signal output by programmable divider 377 is a selectable one of the following: 12.5 kHz, 50 kHz, 100 kHz, 200 kHz and 400 kHz.

During each on pulse of main external switch 205, the current flowing through switch 205 increases. Current sense terminal CSM 378 is coupled to package terminal CSM 209, and is used to detect the magnitude of this increasing current by measuring a voltage drop across external current sense resistor 208. Current sense resistor 208 is disposed in the current path of the main switch 205 as illustrated in FIG. 4A. A CSM mode detect block 379 receives the voltage on the package terminal CSM 209 via die terminal 378 and from this voltage determines whether the CSM terminal has been connected in a high-side current sense configuration or in a low-side current sense configuration. If the CSM mode detect block 379 detects that a high-side current sense is required, then the CSM mode detect block 379 controls switch 380 to couple the voltage from terminal VP 159 into the inverting input lead of amplifier 381 such that amplifier 381 amplifies the voltage difference between the voltage on terminal CSM 378 and the voltage on terminal VP 159. If the CSM mode detect block 379 detects that a low-side current sense is required, then the CSM mode detect block 379 controls switch 380 to couple ground potential from terminal 382 onto the inverting input lead of amplifier 380 such that amplifier 380 amplifies the voltage difference between the voltage on terminal CSM 378 and ground.

When the overall switching power supply (CSPSPWM, driver, and external components) is operating, and when the main external switch 205 of the power supply is controlled to be on during a pulse, the amplified current sense signal 383 output by amplifier 381 increases until it exceeds the magnitude of an error signal 384 present on node 385. When the amplified current sense signal 383 exceeds this level, then comparator 386 switches its output signal level from a low digital level to a high digital level. This high digital level signal resets flip-flop 387, thereby terminating the on pulse. Terminating the on pulse turns off the external main switch 205.

The main power supply output voltage VP 156 being generated by the overall power supply is to be present on package terminal VP 157, which in turn supplies VP 156 onto VP terminal 159 via bond wire 156. If the voltage on terminal VP 157 is higher then less power is required, whereas if the voltage on terminal VP 157 is lower then more power is required. Accordingly, the voltage difference between the voltage on terminal VP 157 (as divided down by a programmable resistor voltage divider FB 388) and a reference voltage (as output by a 1.2 volt band gap voltage generator 389) is amplified by an error amplifier 390, thereby generating the analog ERROR signal 384 on node 385. As the switching power supply operates, the analog ERROR signal 384 goes up in voltage if more power is required, and goes down in voltage if less power is required. The ERROR signal 384 output by error amplifier 390 is limited by a DC clamp circuit 391. The output lead of DC clamp circuit 391 is coupled to the output lead of error amplifier 390. The voltage level to which the clamp circuit 391 clamps the highest possible signal level of the ERROR signal 384 is programmable and is set by setting an 8-bit input value supplied onto inputs 392 of an 8-bit IMOD digital-to-analog converter (DAC) 393.

A programmable driver 394 receives the signal output by the CSPSPWM 372 (the output of flip-flop 387) and drives driver package terminal DRM 207 via terminal 395. If the signal supplied to driver 394 is a digital logic high then driver 394 outputs the voltage on the VHM terminal 374, onto the DRM terminal 395 and onto DRM package terminal 209. This corresponds to turning on external switch 205. If, on the other hand, the signal supplied to driver 394 is a digital logic low, then driver 394 outputs the voltage on ground terminal 382, onto the DRM terminal 395 and onto DRM package terminal 207. This corresponds to turning off the external switch 205.

Power manager 220 includes configuration register 396 used to store configuration information. Processor 221 of PMIC die 108 configures power manager 220 by writing configuration bits into configuration register 396 over local bus 223. Processor 221 configures power manager 220 according to program code 249 stored in memory 222.

Figure 9:
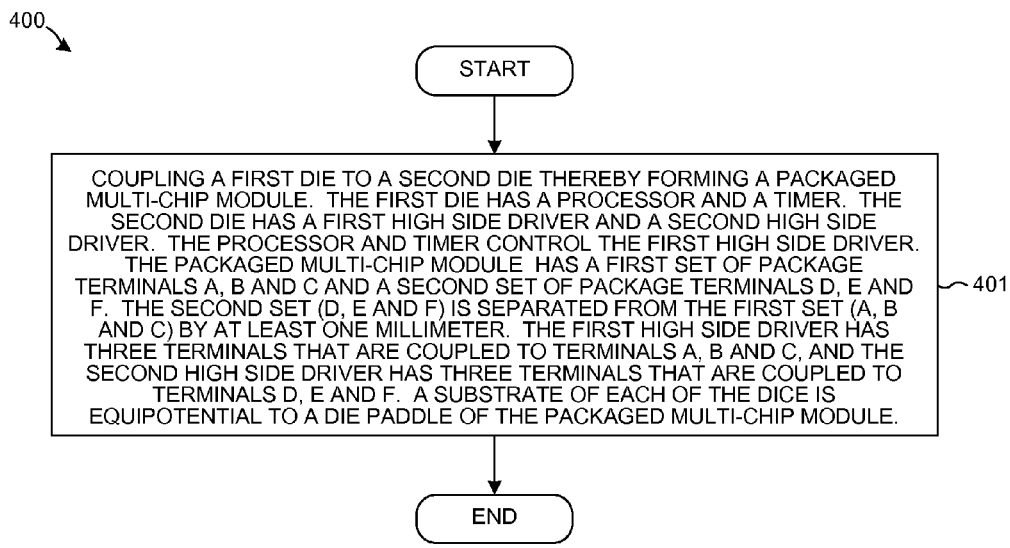
FIG. 9 is a flowchart of a method 400 in accordance with one novel aspect.

FIG. 9 is a flowchart of method 400 of manufacturing a multi-chip module in accordance with one novel aspect. A first die is coupled (step 401) to a second die, thereby forming a packaged multi-chip module, where the first die has a processor and a timer, where the second die has a first high-side driver and a second high-side driver, but has no low-side driver. The first high-side driver is coupled to a first set of package terminals. The second high-side driver is coupled to the second set of package terminals. The first and second sets of package terminals are separated from one another by at least one millimeter.

For example, FIG. 3 shows PMIC die 108 is coupled to UHVHDIC die 109, thereby forming a part of a packaged multi-chip module 100. The first die 108 has a processor 221 and a timer 224. The second die 109 has a first high-side driver 250 and a second high-side driver 251, but has no low-side driver. The packaged multi-chip module 100 has a first set of package terminals A, B and C, a second set of package terminals D, E and F, and a low-side driver output package terminal G. The first high-side driver 250 has three terminals that are coupled to package terminals A, B and C, and the second high-side driver 251 has three terminals that are coupled to package terminals D, E and F. FIG. 3 identifies a two millimeter terminal pitch distance between the first set of three package terminals 114 and the second set of three package terminals 118. There is no other terminal between the first set and the second set.

Although certain specific embodiments are described above for instructional purposes, the teachings of this patent document have general applicability and are not limited to the specific embodiments described above. The substrate material of the second die into which the DMOS transistors are formed may be wafer monocrystalline silicon material or may be an epitaxial layer disposed over wafer material. The DMOS transistors can be fabricated using any suitable one of several different known and commercially used semiconductor fabrication processes including a Bipolar Complementary Double-diffused Metal-Oxide-Semiconductor (BiCDMOS) semiconductor fabrication process. Accordingly, various modifications, adaptations, and combinations of various features of the described embodiments can be practiced without departing from the scope of the invention as set forth in the claims.

What is claimed is:

1. A packaged multi-chip module, comprising:
   a first set of three package terminals A, B and C;
   a second set of three package terminals D, E and F that is separated from the first set by at least one millimeter;
   a low-side driver output package terminal G;
   at least two dice that include a processor, a timer, a low-side driver, a first high-side driver and a second high-side driver, wherein a first of the two dice includes the processor and the timer, wherein a second of the two dice includes the first and second high-side drivers, wherein the first high-side driver is controllable by the processor and the timer, wherein three terminals of the first high-side driver are coupled to the first set of three package terminals A, B and C, wherein three terminals of the second high-side driver are coupled to the second set of three package terminals D, E and F, and wherein the low-side driver is coupled to the low-side driver output package terminal G; and
   a die paddle, wherein each of the at least two dice has a substrate, wherein the substrate of the second of the at least two dice is a P-type substrate, and wherein the substrate of each of the at least two dice is equipotential to the die paddle.

2. The packaged multi-chip module of claim 1, wherein a first set of voltages is present on the first set of three package terminals A, B and C during operation of the packaged multi-chip module, wherein each voltage of the first set of voltages is within twenty volts of each of the other voltages of the first set of voltages, wherein a second set of voltages is present on the second set of three package terminals D, E and F during the operation of the packaged multi-chip module, wherein each voltage of the second set of voltages is within twenty volts of each of the other voltages of the second set of voltages, and wherein a difference between one of the first set of voltages and one of the second set of voltages is at least eighty volts.

3. The packaged multi-chip module of claim 1, wherein the first of the two dice includes Complementary Metal-Oxide-Semiconductor (CMOS) circuitry and includes no Double-diffused Metal-Oxide-Semiconductor (DMOS) circuitry capable of operating above one-hundred volts, and the second of the two dice includes DMOS circuitry capable of operating above one-hundred volts.

4. The packaged multi-chip module of claim 1, wherein the first of the two dice includes the low-side driver, wherein the low-side driver drives a gate of a low-side transistor external to the packaged multi-chip module, wherein the packaged multi-chip module includes a pulse-width controller, wherein the pulse-width controller is part of a switching power supply that generates a supply voltage, and wherein the supply voltage is supplied to the low-side driver.

5. The packaged multi-chip module of claim 1, wherein the packaged multi-chip module includes a pulse-width controller, wherein the pulse-width controller is part of a switching power supply that generates a supply voltage, wherein the first high-side driver of the second of the two dice is supplied by the supply voltage and generates a set of voltages, and wherein one of the set of voltages is supplied to a gate of a high-side transistor.

6. The packaged multi-chip module of claim 1, wherein the packaged multi-chip module includes a voltage detect package terminal, wherein the first of the two dice further includes a protection control circuit, wherein the protection control circuit supplies a digital logic disable signal to the second of the two dice via a disable terminal of the first of the two dice, and wherein a signal propagation delay from the voltage detect package terminal to the disable terminal is not affected by an execution time of any instruction executed by the processor.

7. The packaged multi-chip module of claim 6, wherein no structure capable of executing instructions causes the digital logic disable signal to switch.

8. The packaged multi-chip module of claim 1, wherein the packaged multi-chip module includes more than one high-side driver, and wherein the second of the two dice does not include any low-side drivers.

9. The packaged multi-chip module of claim 1, further comprising:
   a third set of three package terminals, wherein the second of the two dice further includes a third high-side driver, wherein three terminals of the third high-side driver are coupled to the third set of three package terminals, and wherein the first, second and third set of three package terminals drive a three-phase electric motor.

10. A method, comprising:
(a) coupling a first die to a second die thereby forming a packaged multi-chip module, wherein the first die includes a processor and a timer, wherein the second die includes a first high-side driver and a second high-side driver, wherein the first high-side driver is controllable by the processor and the timer, wherein the packaged multi-chip module includes a first set of three package terminals A, B and C and a second set of three package terminals D, E and F, wherein the second set is separated from the first set by at least one millimeter, wherein three terminals of the first high-side driver are coupled to the first set of three package terminals A, B and C, wherein three terminals of the second high-side driver are coupled to the second set of three package terminals D, E and F, and wherein a substrate of each of the first die and second die is equipotential to a die paddle of the packaged multi-chip module.

11. The method of claim 10, wherein a first set of voltages is present on the first set of three package terminals A, B and C during operation of the packaged multi-chip module, wherein each voltage of the first set of voltages is within twenty volts of each of the other voltages of the first set of voltages, wherein a second set of voltages is also present on the second set of three package terminals D, E and F during the operation of the packaged multi-chip module, wherein each voltage of the second set of voltages is within twenty volts of each of the other voltages of the second set of voltages, and wherein a difference between one of the first set of voltages and one of the second set of voltages is at least eighty volts.

12. The method of claim 10, wherein the first die includes Complementary Metal-Oxide-Semiconductor (CMOS) circuitry and includes no Double-diffused Metal-Oxide-Semiconductor (DMOS) circuitry capable of operating above one-hundred volts, and wherein the second die has a P-type substrate and includes DMOS circuitry capable of operating above one-hundred volts.

13. The method of claim 10, wherein the first die includes a low-side driver, wherein the low-side driver drives a gate of a low-side transistor external to the packaged multi-chip module, wherein the packaged multi-chip module includes a pulse-width controller, wherein the pulse-width controller is part of a switching power supply that generates a supply voltage, and wherein the supply voltage is supplied to the low-side driver.

14. The method of claim 10, wherein the packaged multi-chip module includes a pulse-width controller, wherein the pulse-width controller is part of a switching power supply that generates a supply voltage, wherein the first high-side driver of the second die is supplied by the supply voltage and generates a set of voltages, and wherein one of the set of voltages is supplied to a gate of the high-side transistor.

15. The method of claim 10, further comprising the step of:
(b) providing a connection from the first die to the second die that carries a digital logic enable signal, wherein the packaged multi-chip module includes a voltage detect package terminal, wherein the first die further includes a protection control circuit and a disable terminal, wherein the connection extends from the disable terminal to a terminal of the second die, wherein the protection control circuit supplies the digital logic disable signal to the second die via the connection, and wherein a signal propagation delay from the voltage detect package terminal to the disable terminal is not affected by an execution time of any instruction executed by the processor.

16. The method of claim 15, wherein no structure capable of executing instructions causes the digital logic disable signal to switch.

17. The method of claim 10, wherein the packaged multi-chip module includes more than one high-side driver, and wherein the second die does not include any low-side drivers.

18. The method of claim 10, further comprising the step of:
(b) using the packaged multi-chip module to drive a three-phase electric motor.

19. A packaged multi-chip module, comprising:
a first die that includes a processor and a timer; and
means for supplying and controlling at least two sets of high-side driver voltages, wherein a first of the two sets of high-side driver voltages is supplied onto a first set of three package terminals A, B and C of the packaged multi-chip module, wherein a second of the two sets of high-side driver voltages is supplied onto a second set of three package terminals D, E and F of the packaged multi-chip module, and wherein the second set of three package terminals D, E and F is separated from the first set of three package terminals A, B and C by at least one millimeter.

20. The packaged multi-chip module of claim 19, wherein each voltage of the first set of high-side driver voltages is within twenty volts of each of the other voltages of the first set, wherein each voltage of the second set of high-side driver voltages is within twenty volts of each of the other voltages of the second set, and wherein a difference between one of the high-side driver voltages of the first set and one of the high-side driver voltages of the second set is at least eighty volts.

21. The packaged multi-chip module of claim 19, wherein the means is a second die that includes a first high-side driver and a second high-side driver, wherein the first high-side driver generates the first of the two sets of high-side driver voltages, wherein the second high-side driver generates the second of the two sets of high-side driver voltages, wherein the first die includes Complementary Metal-Oxide-Semiconductor (CMOS) circuitry and includes no Double-diffused Metal-Oxide-Semiconductor (DMOS) circuitry capable of operating above one-hundred volts, and wherein the second die includes DMOS circuitry capable of operating above one-hundred volts.

22. A system, comprising:
a multi-chip module comprising:
a low-side driver output package terminal G;
a first die that has a processor, a timer, a pulse width modulator circuit and at least one low-side driver coupled to the low-side driver output package terminal G;
a first set of three package terminals A, B and C;
a second set of three package terminals D, E and F that is separated from the first set by at least one millimeter; and
a second die having a first high-side driver and a second high-side driver, wherein three terminals of the first high-side driver are coupled to the first set of three package terminals A, B and C, and wherein three terminals of the second high-side driver are coupled to the second set of three package terminals D, E and F;
a high-side transistor, wherein a gate of the high-side transistor is coupled to one of the set of three package terminals A, B and C;
a low-side transistor, wherein the low-side driver output package terminal G is coupled to a gate of the low-side transistor; and a three-phase electric motor, wherein a source of the high-side transistor is coupled to a winding terminal of the motor, and wherein a drain of the low-side transistor is coupled to the winding terminal of the motor.

* * * * *